(12) United States Patent
Liu et al.

(10) Patent No.: US 11,258,043 B2
(45) Date of Patent: Feb. 22, 2022

(54) FLEXIBLE DISPLAY MODULE AND DISPLAY DEVICE

(71) Applicant: BOE TECHNOLOGY GROUP CO., LTD., Beijing (CN)

(72) Inventors: Lu Liu, Beijing (CN); Shan-Chen Kao, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 16/799,889

(22) Filed: Feb. 25, 2020

(65) Prior Publication Data

US 2020/0194723 A1 Jun. 18, 2020

Related U.S. Application Data

(63) Continuation-in-part of application No. 15/580,349, filed as application No. PCT/CN2017/089360 on Jun. 21, 2017, now Pat. No. 10,608,200.

(30) Foreign Application Priority Data

Dec. 9, 2016 (CN) .......................... 201611132175.3

(51) Int. Cl.
*B32B 7/12* (2006.01)
*H01L 51/52* (2006.01)
(Continued)

(52) U.S. Cl.
CPC ............ *H01L 51/5253* (2013.01); *B32B 7/12* (2013.01); *B32B 17/06* (2013.01); *B32B 27/281* (2013.01);
(Continued)

(58) Field of Classification Search
CPC ................ B32B 17/06; B32B 2255/10; B32B 2307/412; B32B 2307/42; B32B 2307/51;
(Continued)

(56) References Cited

U.S. PATENT DOCUMENTS 9,029,846 B2 5/2015 Song et al.
2014/0367644 A1 12/2014 Song et al.
(Continued)

FOREIGN PATENT DOCUMENTS

AU 2015355047 6/2017
CN 104241316 12/2014
(Continued)

OTHER PUBLICATIONS

Office action from U.S. Appl. No. 15/580,349 dated Aug. 20, 2019.
(Continued)

*Primary Examiner* — Lawrence D Ferguson
(74) *Attorney, Agent, or Firm* — Calfee, Halter & Griswold LLP

(57) ABSTRACT

A flexible display panel includes a flexible substrate; a display layer on the flexible substrate; a reinforcement layer on a side of the display layer distal to the flexible substrate; and a protective layer on a side of the reinforcement layer distal to the flexible substrate; wherein the reinforcement layer is a multi-layer laminate structure comprising at least one colorless polymide layer and the reinforcement layer is configured to enhance the reliability testing of the flexible display panel.

15 Claims, 11 Drawing Sheets

(51) Int. Cl.
  *B32B 17/06* (2006.01)
  *B32B 27/28* (2006.01)
(52) U.S. Cl.
  CPC ..... *B32B 2255/10* (2013.01); *B32B 2307/412* (2013.01); *B32B 2307/42* (2013.01); *B32B 2307/546* (2013.01); *B32B 2457/208* (2013.01); *H01L 2251/5338* (2013.01)
(58) Field of Classification Search
  CPC .......... B32B 2307/54; B32B 2307/546; B32B 2307/732; B32B 2457/206; B32B 2457/208; B32B 27/08; B32B 27/281; B32B 7/12; H01L 2251/5338; H01L 27/323; H01L 51/5237; H01L 51/5253; H01L 51/5281
  See application file for complete search history.

(56) References Cited

U.S. PATENT DOCUMENTS

2015/0337100 A1* 11/2015 Woo ............... C09D 179/08
  428/141
2016/0155967 A1 6/2016 Lee et al.

FOREIGN PATENT DOCUMENTS

| | | |
|---|---|---|
| CN | 105977277 | 9/2016 |
| CN | 106155399 | 11/2016 |
| CN | 106710449 | 5/2017 |
| TW | M512744 | 11/2015 |
| TW | I553529 | 10/2016 |
| TW | 201638745 | 11/2016 |
| WO | 2016085182 | 6/2016 |

OTHER PUBLICATIONS

Office action from Chinese Application No. 201611132175.3 dated Jul. 9, 2019.
Office action from Chinese Application No. 201611132175.3 dated Feb. 26, 2019.
Office action from Chinese Application No. 201611132175.3 dated Oct. 31, 2018.
Office action from Chinese Application No. 201611132175.3 dated Jun. 4, 2018.
Office action from Chinese Application No. 201611132175.3 dated Oct. 9, 2017.
International Search Report and Written Opinion from PCT/CN2017/089360 dated Aug. 24, 2017.

* cited by examiner

| Protective layer | 300 |
| --- | --- |
| Touch layer | 600 |
| Polarizing layer | 500 |
| Strengthening layer | 400 |
| Display layer | 200 |
| Flexible substrate | 100 |
| Base film and other protective layers | 700 |

Fig. 3C

| Protective layer | 300 |
| --- | --- |
| Reinforcement layer | 400 |
| Polarizing layer | 500 |
| Touch layer | 600 |
| Display layer | 200 |
| Flexible substrate | 100 |
| Base film and other protective layers | 700 |

Fig. 3D

| Protective layer | — 1300 |
| --- | --- |
| Reinforcement layer | — 1400 |
| Polarizing layer | — 1500 |
| Touch layer | — 1600 |
| Display layer | — 1200 |
| Bottom layer | — 1700 |
| Third optical clear adhesive layer | — 1800 |
| Flexible substrate | — 1100 |

Fig. 5B

| Protective layer | — 1300 |
| --- | --- |
| Reinforcement layer | — 1400 |
| Polarizing layer | — 1500 |
| Touch layer | — 1600 |
| Display layer | — 1200 |
| Pressure sensitive adhesive layer | — 1701 |
| polyimide layer | — 1702 |
| Third optical clear adhesive layer | — 1800 |
| Flexible substrate | — 1100 |

Fig. 5C

FLEXIBLE DISPLAY MODULE AND DISPLAY DEVICE

CROSS REFERENCE

This application is a Continuation-in-Part application of U.S. patent application Ser. No. 15/580,349 filed on Dec. 7, 2017, which is based on International Application No. PCT/CN2017/089360, filed on Jun. 21, 2017, which is based upon and claims priority to Chinese Patent Application No. 201611132175.3 filed on Dec. 9, 2016, titled "FLEXIBLE DISPLAY MODULE AND DISPLAY DEVICE", and the entire contents thereof are incorporated herein by reference.

TECHNICAL FIELD

The present disclosure relates to the field of flexible display technology, and more particularly, to a flexible display module and a display device.

BACKGROUND

The present flexible display module consists of a multi-layer film structure, and a general flexible display module includes, arranged sequentially on a flexible substrate, a display layer (including an OLED display device and a pixel circuit), a circularly polarized light layer (C-POL), a touch layer, a protective layer, and a base film disposed on the back of the flexible substrate, etc. Among them, the protective layer plays a role in protecting the overall flexible display module.

In order to meet the bending characteristics of the flexible display module, there is a limit to the thickness of the flexible protective layer of the flexible display module, thereby affecting the protective properties of the protective layer to the underlying OLED device. In the ball drop test, although the protective layer is not damaged, the OLED device in the flexible display module may have failures which show up as extremely large black spots. As the thickness of the protective layer increases, the protection characteristics of the OLED device will be improved, but the bending characteristics of the flexible display module are affected.

Therefore, how to enhance the reliability of the flexible display module while maintaining the bending characteristics of the flexible display module is a technical problem that needs to be solved in the field.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a flexible display module and a display device.

The embodiments of the present disclosure provide a flexible display module, including a flexible substrate, a display layer disposed on the flexible substrate, a protective layer disposed on the display layer, and a reinforcement layer disposed between the display layer and the protective layer, the modulus of the reinforcement layer being greater than or equal to the modulus of any of the layers in the flexible display module.

In one possible embodiment, the flexible display module provided by the embodiments of the present disclosure further includes a polarizing layer disposed between the display layer and the protective layer, the reinforcement layer being adjacent to the display layer.

In one possible embodiment, the flexible display module provided by the embodiments of the present disclosure further includes a touch layer disposed between the polarizing layer and the protective layer, or a touch layer disposed between the polarizing layer and the display layer.

In one possible embodiment, in the flexible display module provided by the embodiments of the present disclosure, thickness of the reinforcement layer ranges from 10 μm to 150 μm.

In one possible embodiment, in the flexible display module provided by the embodiments of the present disclosure, the thickness of the reinforcement layer ranges from 30 μm to 120 μm.

In one possible embodiment, in the flexible display module provided by the embodiments of the present disclosure, the thickness of the reinforcement layer ranges from 30 μm to 100 μm.

In one possible embodiment, in the flexible display module provided by the embodiments of the present disclosure, modulus of the reinforcement layer ranges from 10 Gpa to 200 Gpa.

In one possible embodiment, in the flexible display module provided by the embodiments of the present disclosure, material of the reinforcement layer is soft glass or inorganic fiber-reinforced organic material.

In one possible embodiment, in the flexible display module provided by the embodiments of the present disclosure, transmittance of the reinforcement layer is greater than 90%.

In one possible embodiment, in the flexible display module provided by the embodiments of the present disclosure, the reinforcement layer is fixed to an adjacent layer by a glue material.

As another aspect, the embodiments of the present disclosure further provide a display device including the above flexible display module provided by embodiments of the present disclosure.

As another aspect, the embodiments of the present disclosure further provide a flexible display panel, including: a flexible substrate; a display layer on the flexible substrate; a reinforcement layer on a side of the display layer distal to the flexible substrate; and a protective layer on a side of the reinforcement layer distal to the flexible substrate, wherein the reinforcement layer comprising at least one colorless polyimide layer.

In one possible embodiment, the reinforcement layer comprises a first optical clear adhesive layer, a first colorless polyimide layer on a side of the first optical clear adhesive layer distal to the flexible substrate, a second optical clear adhesive layer on a side of the first colorless polyimide layer distal to the flexible substrate, and a second colorless polyimide layer on a side of the second optical clear adhesive layer distal to the flexible substrate. In one possible embodiment, the reinforcement layer further comprises a hard coating layer on a side of the second colorless polyimide layer distal to the flexible substrate.

In one possible embodiment, modulus of the first colorless polyimide layer ranges from 3 Gpa to 10 Gpa.

In one possible embodiment, a thickness of the first colorless polyimide layer ranges from 35 μm to 100 μm.

In one possible embodiment, the reinforcement layer comprises a first optical clear adhesive layer, a colorless polyimide layer on a side of the first optical clear adhesive layer distal to the flexible substrate, a second optical clear adhesive layer on a side of the colorless polyimide layer distal to the flexible substrate, and an ultra-thin glass layer on a side of the second optical clear adhesive layer distal to the flexible substrate.

In one possible embodiment, the reinforcement layer comprises a first optical clear adhesive layer, a ultra-thin film layer on a side of the first optical clear adhesive layer distal to the flexible substrate, a second optical clear adhesive layer on a side of the UTG layer distal to the flexible substrate, and a colorless polyimide layer on a side of the second optical clear adhesive layer distal to the flexible substrate.

As another aspect, the embodiments of the present disclosure further provide a flexible display device, including: a flexible substrate; a display layer on the flexible substrate; a touch layer on a side of the display layer distal to the substrate; a polarizing layer on a side of the touch layer distal to the flexible substrate; a reinforcement layer on a side of the polarizing layer distal to the flexible substrate; and a protective layer on a side of the reinforcement layer distal to the flexible substrate; wherein the reinforcement layer is a multi-layer laminate structure comprising at least one colorless polyimide layer and the reinforcement layer is configured to enhance the reliability testing of the flexible display device.

In one possible embodiment, the flexible display device further includes a bottom film layer on a side of the display layer proximal to the substrate.

In one possible embodiment, the bottom film layer comprises a pressure sensitive adhesive layer on a side of the display layer proximal to the substrate and a polyimide layer on a side of the pressure sensitive adhesive layer proximal to the substrate.

In one possible embodiment, the flexible display device further includes an optical clear adhesive layer on a side of the bottom film layer proximal to the substrate.

BRIEF DESCRIPTION OF THE DRAWINGS

FIGS. 3A to 3F are yet another structural schematic diagrams of flexible display modules provided by embodiments of the present disclosure, respectively.

FIGS. 5A to 5C are structural schematic diagrams of flexible display devices provided by embodiments of the present disclosure, respectively.

DETAILED DESCRIPTION

The specific implementing manners of a flexible display module and a display device provided by embodiments of the present disclosure will be described in detail in conjunction with the accompanying drawings.

The thickness and shape of each layer in the accompanying drawings do not reflect the true scale of the flexible display module, the purpose of which is merely illustrative of the contents of the present disclosure.

Figure 1:
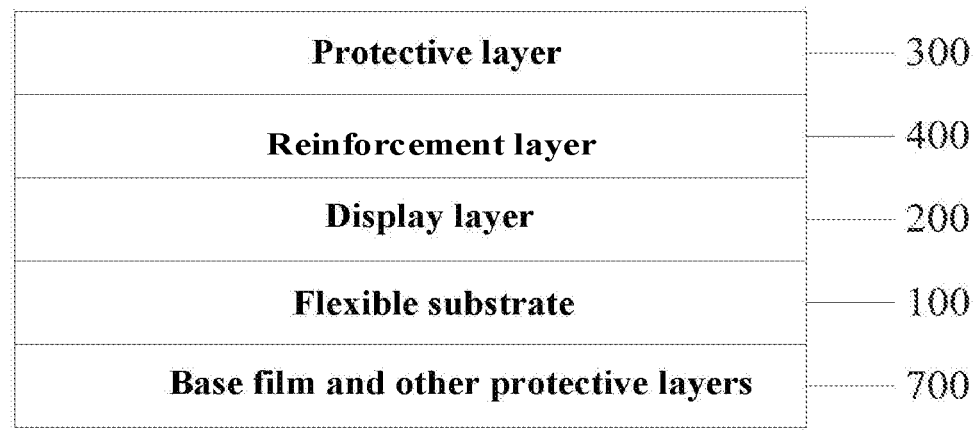
FIG. 1 is a structural schematic diagram of a flexible display module provided by embodiments of the present disclosure.

The embodiments of the present disclosure provide a flexible display module. As shown in FIG. 1, the flexible display module includes: a flexible substrate 100, a display layer 200 disposed on the flexible substrate 100, and a protective layer 300 disposed on the display layer 200. The flexible display module further includes a reinforcement layer 400 disposed between the display layer 200 and the protective layer 300, the modulus of the reinforcement layer 400 being greater than or equal to the modulus of any of the layers in the flexible display module.

In the flexible display module provided by the embodiment of the present disclosure, the reinforcement layer 400 is inserted between the display layer 200 and the protective layer 300, and the modulus of the reinforcement layer 400 is greater than or equal to that of any of the layers in the flexible display module, so that the strained neutral layer in the flexible display module is pulled to the vicinity of the reinforcement layer 400. Since the display layer 200 is closer to the reinforcement layer 400, it is less stressed, so that the bending characteristic of the display layer 200 can be enhanced. Thus, the reliability of the flexible display module in the ball drop test is improved while the thickness of the protective layer 300 does not affect the bending characteristics.

In specific implementation, in the above flexible display module provided by the embodiments of the present disclosure, the material of the protective layer 300 may be a plastic substrate or a glass substrate, which is not limited herein. The thickness of the protective layer can be between 5 μm and 300 μm.

Figure 2A:
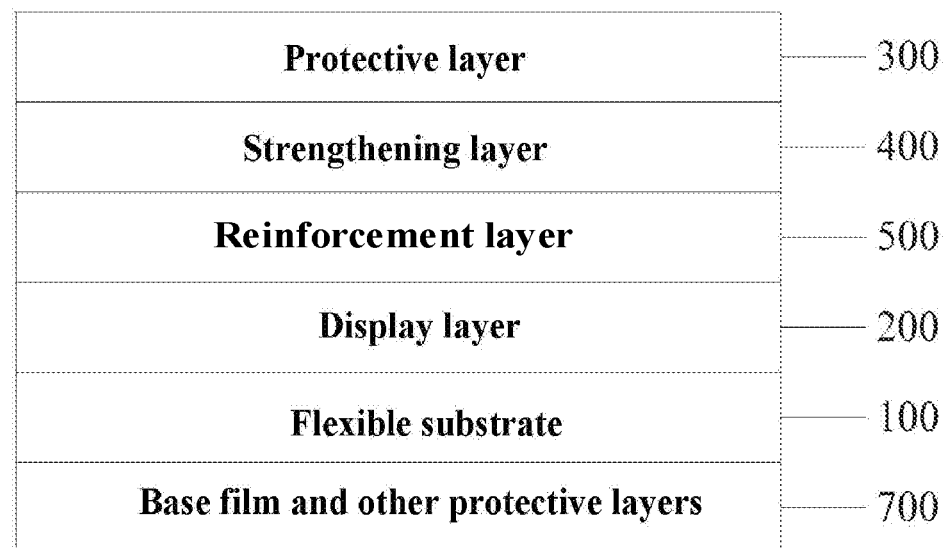
FIGS. 2A and 2B are another structural schematic diagrams of flexible display modules provided by embodiments of the present disclosure, respectively.
Figure 2B:
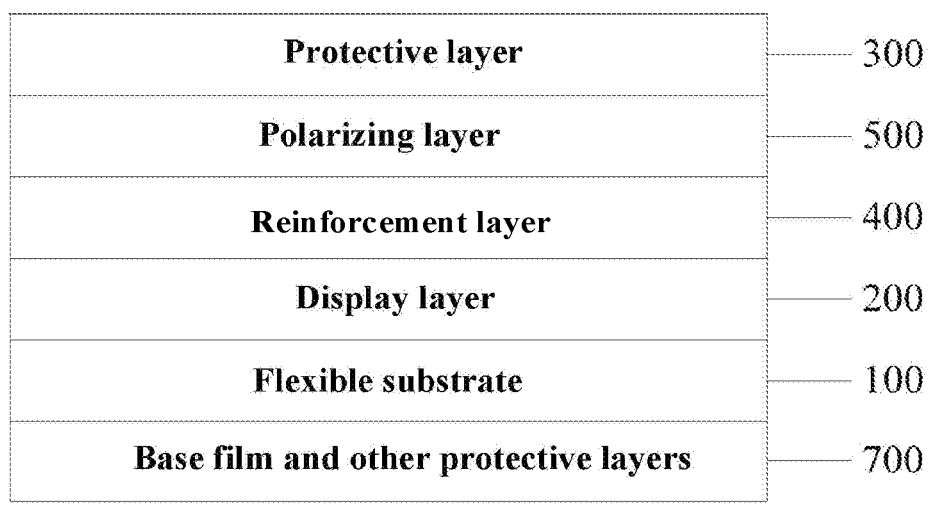

In specific implementation, as shown in FIGS. 2A and 2B, the above flexible display module provided by the embodiments of the present disclosure also includes a polarizing layer 500 disposed between the display layer 200 and the protective layer 300. Generally, a circular polarizing layer is used. In specific implementation, as shown in FIG. 2A, the reinforcement layer 400 may be disposed between the protective layer 300 and the polarizing layer 500. Preferably, as shown in FIG. 2B, the reinforcement layer 400 may also be disposed between the display layer 200 and the polarizing layer 500, that is, the reinforcement layer 400 is adjacent to the display layer 200. Such a structure can reduce the stress imposed on the display layer 200 when it is bent, which helps to prevent the display layer 200 from being damaged during the bending.

Figure 3A:
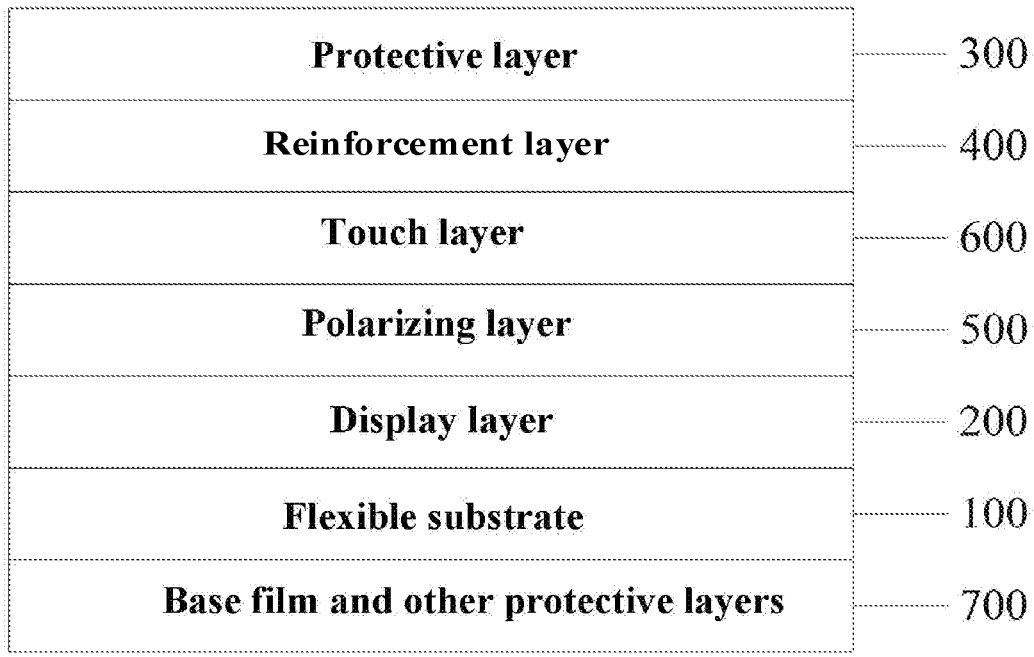
Figure 3B:
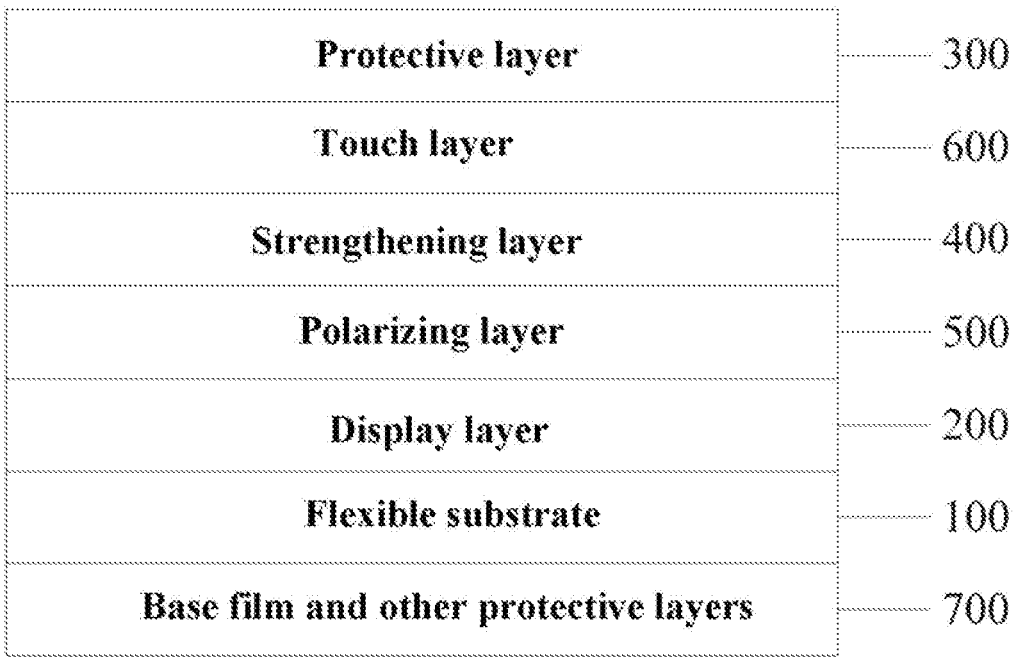

In specific implementation, the above flexible display module provided by the embodiments of the present disclosure further includes a touch layer 600. As shown in FIGS. 3A to 3C, the touch layer 600 can be disposed between the polarizing layer 500 and the protective layer 300. Alternatively, as shown in FIGS. 3D to 3F, the touch layer 600 can be disposed between the polarizing layer 500 and the display layer 200.

Specially, when the touch layer 600 is disposed between the polarizing layer 500 and the protective layer 300, the reinforcement layer 400 may be disposed between the protective layer 300 and the touch layer 600 as shown in FIG. 3A, or the reinforcement layer 400 may be disposed between the touch layer 600 and the polarizing layer 500 as shown in FIG. 3B. In one embodiment, as shown in FIG. 3C, the reinforcement layer 400 may also be disposed between the polarizing layer 500 and the display layer 200, that is, the reinforcement layer 400 is adjacent to the display layer 200. Such a structure can reduce the stress imposed on the display layer 200 when it is bent, which helps to prevent the display layer 200 from being damaged during the bending.

Figure 3E:
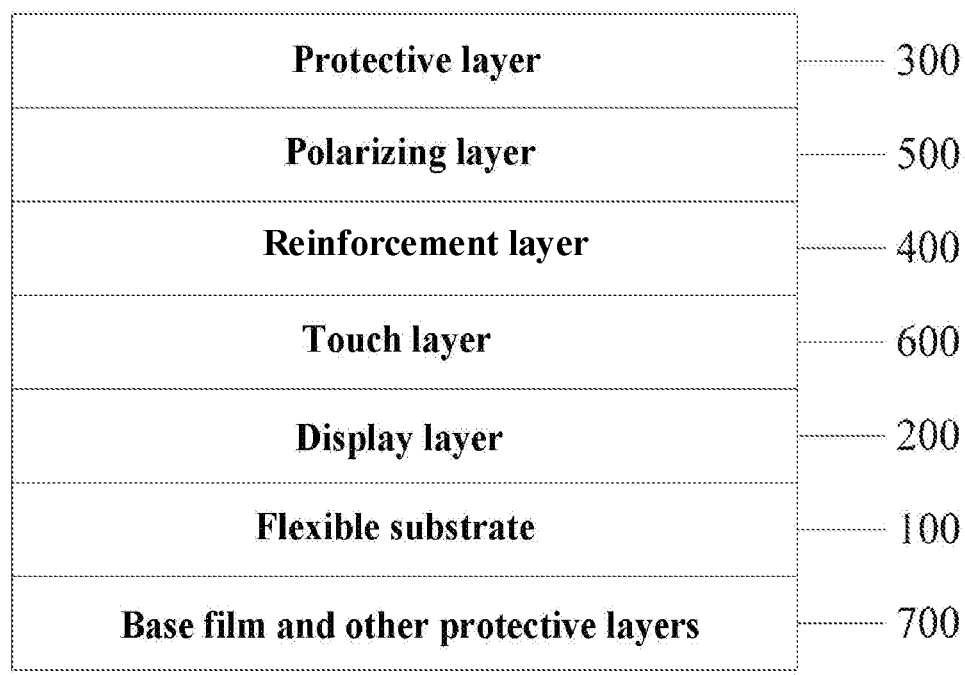
Figure 3F:
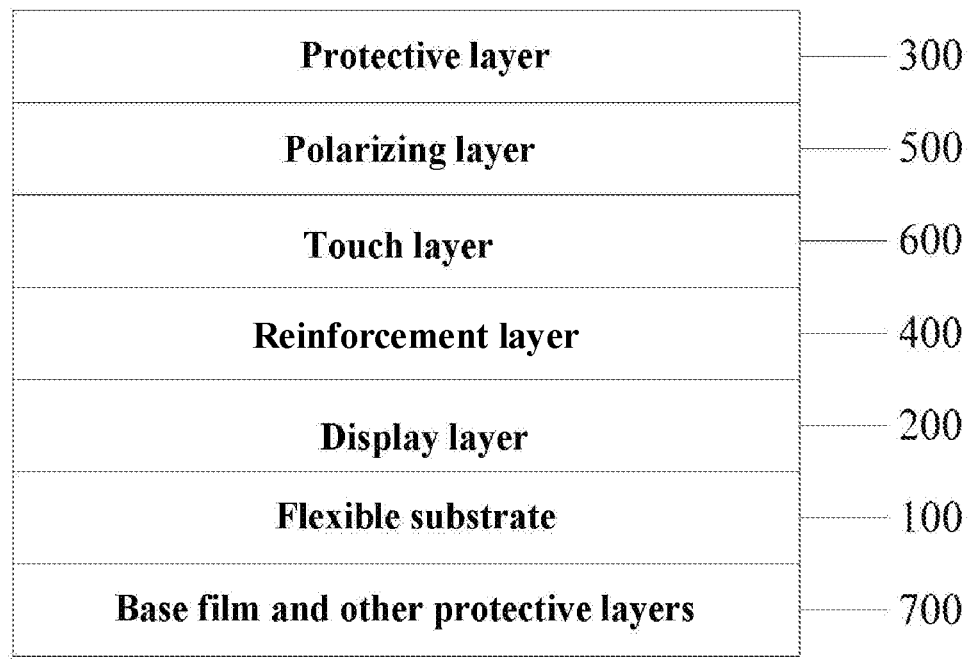

Specifically, when the touch layer 600 is disposed between the polarizing layer 500 and the display layer 200, the reinforcement layer 400 may be disposed between the protective layer 300 and the polarizing layer 500 as shown in FIG. 3D, or the reinforcement layer 400 may be disposed between the polarizing layer 500 and the touch layer 600 as shown in FIG. 3E. In one embodiment, as shown in FIG. 3F, the reinforcement layer 400 may also be disposed between the touch layer 600 and the display layer 200, that is, the reinforcement layer 400 is adjacent to the display layer 200 and the reinforcement layer 400 is also adjacent to the touch layer 600. Such a structure can reduce the stress imposed on the display layer 200 and the touch layer 600 when they are bent, which helps to prevent the display layer 200 and the touch layer 600 from being damaged during the bending.

In addition, as shown in FIG. 1, the above flexible display module provided by the embodiment of the present disclosure also includes a base film and other protective layers 700 provided on the back surface of the flexible substrate 100, which is not limited herein.

In specific implementation, in the above flexible display module provided by the embodiment of the present disclosure, the thickness of the reinforcement layer 400 ranges from 10 μm to 150 μm.

In one embodiment, in the above flexible display module provided in the embodiment of the present disclosure, the thickness of the reinforcement layer 400 ranges from 30 μm to 120 μm.

In one embodiment, in the above flexible display module provided in the embodiment of the present disclosure, the thickness of the reinforcement layer 400 ranges from 30 μm to 100 μm.

In specific implementation, in the above flexible display module provided by the embodiment of the present disclosure, it is required that the modulus of the reinforcement layer 400 ranges from 10 Gpa to 200 Gpa to be higher than that of other layers in the flexible display module.

In specific implementation, in the above flexible display module provided by the embodiment of the present disclosure, the material of the reinforcement layer 400 may be a high modulus material such as soft glass or inorganic fiber-reinforced organic material. Other materials with high modulus may also be used, which is not limited herein. In addition, the reinforcement layer 400 needs to be able to withstand bending of 100,000 times or more with a radius of 1 mm-15 mm.

In specific implementation, in the above flexible display module provided by the embodiment of the present disclosure, the transmittance of the reinforcement layer 400 is greater than 90%, so that the added reinforcement layer 400 does not affect the normal display of the flexible display module.

In specific implementation, in the above flexible display module provided by the embodiment of the present disclosure, the reinforcement layer 400 may be fixed to an adjacent layer by a glue material. In addition, the other layers in the flexible display module provided in the embodiments of the present disclosure, that is, the protective layer 300, the display layer 200, the polarizing layer 500 and the touch layer 600, may be fixedly connected to each other by a glue material.

The structure shown in FIG. 3C is taken as Example 1, the structure shown in FIG. 3F is taken as Example 2, the structure which is similar as that shown in FIG. 3C but without the reinforcement layer 400 is taken as Comparative Example 1, and the structure which is similar as that shown in FIG. 3F but without the reinforcement layer 400 is taken as Comparative Example 2, respectively, the bending test and ball drop test are performed, and the results are shown in the following Table 1.

TABLE 1

|  | Bend 100,000 times with radius of 3 mm | Bend 100,000 times with radius of 5 mm | 0.1 J of ball drop impact energy | 0.2 J of ball drop impact energy |
| --- | --- | --- | --- | --- |
| Example 1 | OK | OK | OK | OK |
| Example 2 | OK | OK | OK | OK |
| Comparative Example 1 | OK | OK | NG | NG |
| Comparative Example 2 | OK | OK | NG | NG |

Wherein, the ball drop test method used is described as follows.

The flexible display module is placed with the display surface facing upwards and then firmly fixed in a specific area of the sample stage. During the test, in order to protect the flexible printed circuit (FPC) and the driving part from being damaged by the heavy ball, the edge of the FPC of the flexible display module and the driving IC end should be fixed outside the falling range of the heavy ball. A steel ball with mass of 32.65 g and diameter of 20 mm free falls from a certain height and arrives at different parts of the window area of the flexible display module. After each one point is tested, the appearance and mechanical functions of the flexible display module are checked, and electrical functions of the flexible display module are tested. The table of test height and corresponding energy is shown in the following Table 2.

TABLE 2

| Table of comparing test energy | |
| --- | --- |
| Diameter of steel ball (mm) | ø20 |
| Mass of steel ball (g) | 32.65 |
| Impact energy (J) | Corresponding height (cm) |
| 0.10 | 31.5 |
| 0.20 | 62.5 |

In the flexible display module and the display device provided by the embodiment of the present disclosure, a reinforcement layer is inserted between the display layer and the protective layer, and the modulus of the reinforcement layer is greater than or equal to that of any of the layers in the flexible display module, so that the strained neutral layer in the flexible display module is pulled to the vicinity of the reinforcement layer. Since the display layer is closer to the reinforcement layer, it is less stressed, so that the bending characteristic of the display layer can be enhanced. Thus, the reliability of the flexible display module in the ball drop test is improved while the thickness of the protective layer does not affect the bending characteristics.

Some embodiments of the present disclosure provide a flexible display panel. As shown in FIGS. 4A-4E, a flexible display panel includes a flexible substrate 1100, a display layer 1200 on the flexible substrate, a reinforcement layer 1400 on a side of the display layer 1200 distal to the flexible substrate; and a protective layer 1300 on a side of the reinforcement layer 1400 distal to the flexible substrate. The reinforcement layer is a multi-layer laminate structure including at least one colorless polyimide layer and the reinforcement layer is configured to enhance the reliability testing of the flexible display panel.

Figure 4A:
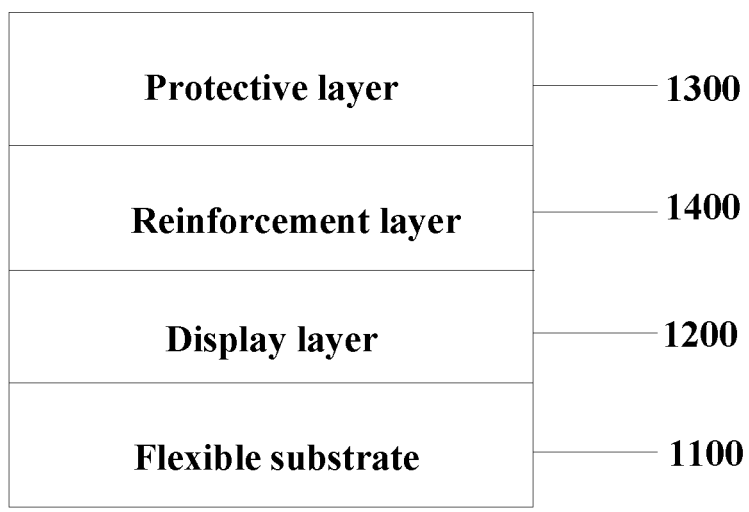
FIGS. 4A to 4E are structural schematic diagrams of flexible display panels provided by embodiments of the present disclosure, respectively.
Figure 4B:
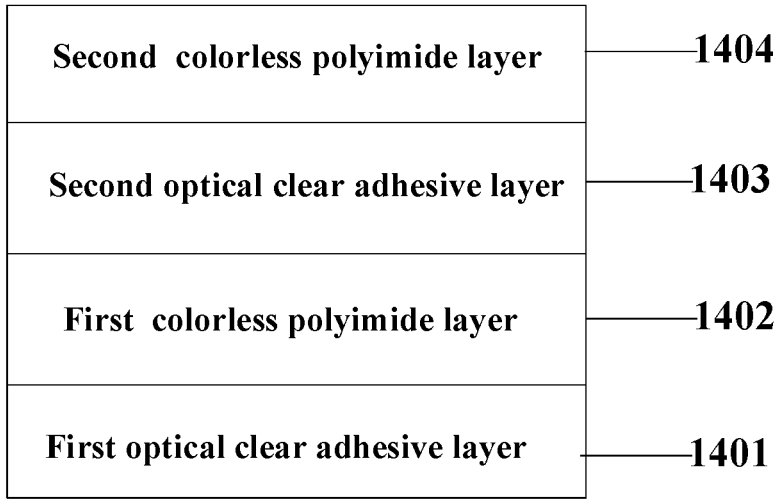
Figure 4C:
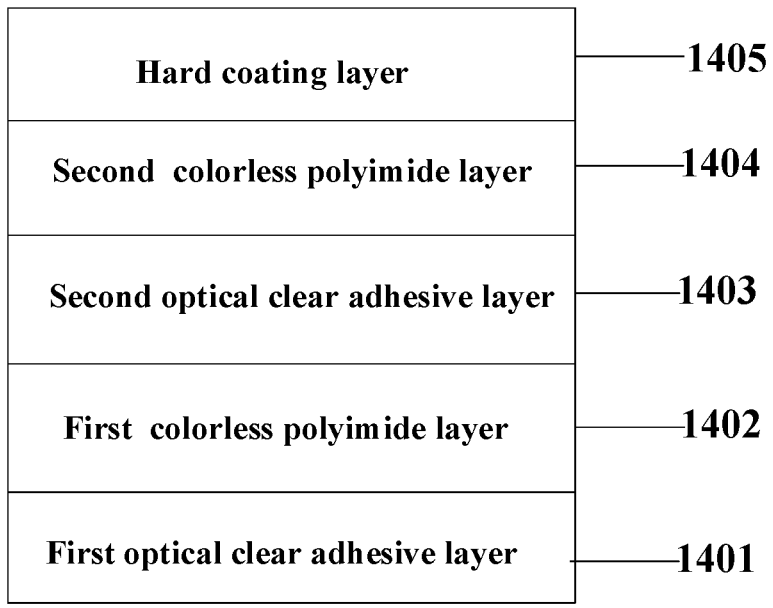

In one embodiment, as shown in FIGS. 4B and 4C, the reinforcement layer includes a first optical clear adhesive layer 1401, a first colorless polyimide layer on a side of the first optical clear adhesive layer distal to the flexible substrate 1402, a second optical clear adhesive layer 1403 on a side of the first colorless polyimide layer distal to the flexible substrate, and a second colorless polyimide layer 1404 on a side of the second optical clear adhesive layer distal to the flexible substrate.

The elastic modulus of the first colorless polyimide layer ranges from 3 Gpa to 10 Gpa. The elastic modulus of the second colorless polyimide layer ranges from 3 Gpa to 10 Gpa. The thickness of the first colorless polyimide layer is ranges from 35 μm to 100 μm. In an exemplary embodiment, the thickness of the first colorless polyimide layer is 80 μm. The thickness of the second colorless polyimide layer ranges from 35 μm to 100 μm. In an exemplary embodiment, the thickness of the second colorless polyimide layer is 80 μm.

As shown in FIG. 4C, the reinforcement layer further comprises a hard coating layer 1405 on a side of the second colorless polyimide layer 1404 distal to the flexible substrate. The material of the hard coating layer may be acrylic polymer. The thickness of the hard coating layer is 10 μm.

In the flexible display panel provided by the embodiment of the present disclosure, the reinforcement layer 1400 is inserted between the display layer 1200 and the protective layer 1300. The reinforcement layer 1400 is a multi-layer laminate structure including at least one colorless polyimide layer and the modulus of the reinforcement layer 1400 is greater than or equal to that of any of the layers in the flexible display panel, so that the strained neutral layer in the flexible display module is pulled to the vicinity of the reinforcement layer 1400. Since the display layer 200 is closer to the reinforcement layer 1400, it is less stressed, so that the bending characteristic of the display layer 1200 can be enhanced. Thus, the reliability of the flexible display panel in the ball drop test is improved.

Figure 4D:
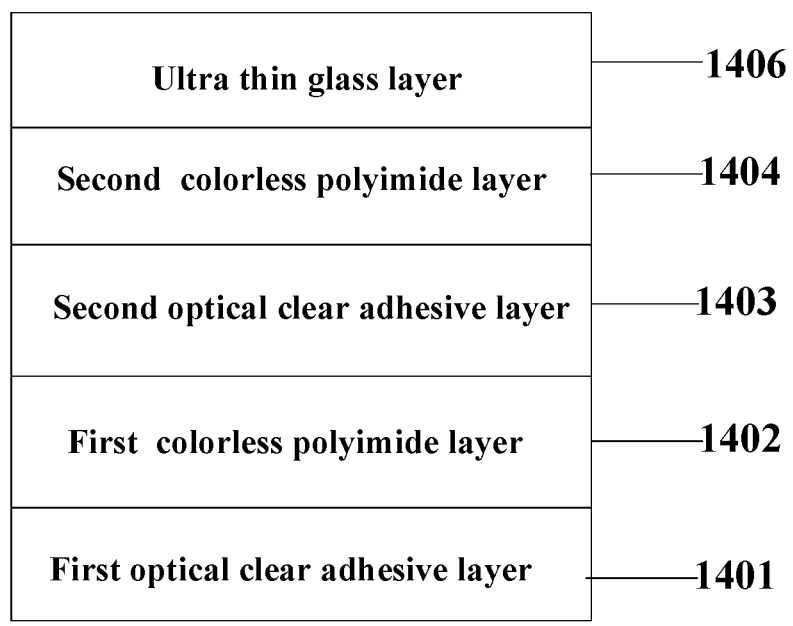

In one embodiment, as shown in FIG. 4D, the reinforcement layer comprises a first optical clear adhesive layer 1401, a colorless polyimide layer 1402 on a side of the first optical clear adhesive layer 1401 distal to the flexible substrate, a second optical clear adhesive layer 1403 on a side of the colorless polyimide layer 1402 distal to the flexible substrate, and an ultra-thin glass (UTG) layer 1406 on a side of the second optical clear adhesive layer distal to the flexible substrate. The ultra-thin glass layer 1406 includes the glass whose elastic modulus ranges from 60 Gpa to 100 Gpa. The thickness of the ultra-thin glass layer 1406 ranges from 50 to 100 μm.

Figure 4E:
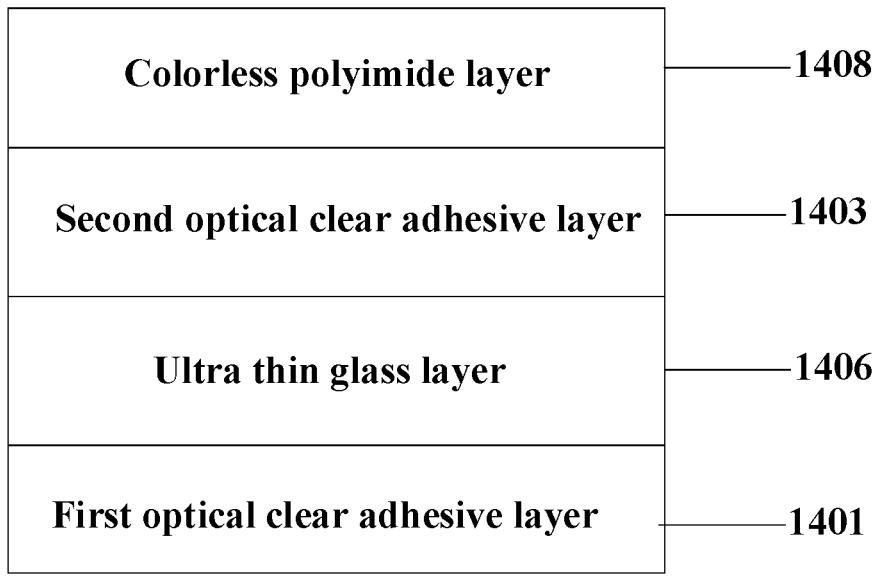

In one embodiment, as shown in FIG. 4E, the reinforcement layer includes a first optical clear adhesive layer 1401, an ultra-thin glass layer 1406 on a side of the first optical clear adhesive layer 1401 distal to the flexible substrate, a second optical clear adhesive layer 1403 on a side of the ultra-thin glass layer 1406 layer distal to the flexible substrate, and a colorless polyimide layer 1408 on a side of the second optical clear adhesive layer distal 1403 to the flexible substrate.

The reinforcement layer is a multi-layer laminate structure including at least one colorless polyimide layer. The reinforcement layer may include two one colorless polyimide layers to enhance the reliability testing of the flexible display panel. In another embodiment, the may include one colorless polyimide layers and one ultra-thin glass layer to enhance the reliability testing of the flexible display panel.

Figure 5A:
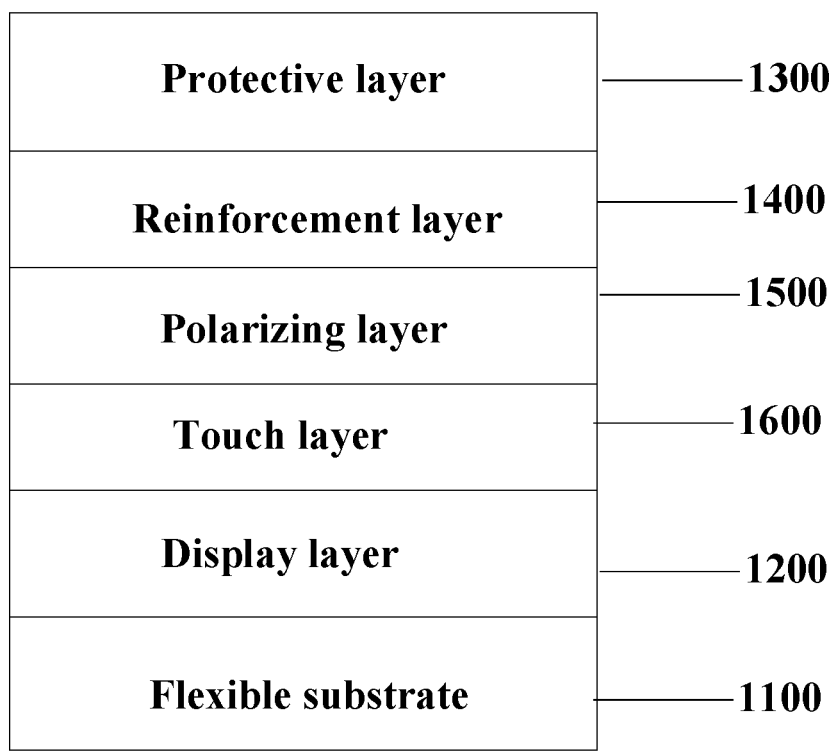

Some embodiments of the present disclosure provide a flexible display device. As shown in FIGS. 5A-5C, the flexible display device includes: a flexible substrate 1100; a display layer 1200 on the flexible substrate; a touch layer 1600 on a side of the display layer 1200 distal to the substrate; a polarizing layer on a side of the touch layer 1600 distal to the flexible substrate; a reinforcement layer 1400 on a side of the polarizing layer 1500 distal to the flexible substrate; a protective layer 1300 on a side of the reinforcement layer 1400 distal to the flexible substrate; wherein the reinforcement layer is a multi-layer laminate structure including at least one colorless polyimide layer and the reinforcement layer is configured to enhance the reliability testing of the flexible display device.

In one embodiment, the reinforcement layer comprises a first optical clear adhesive layer, a first colorless polyimide layer on a side of the first optical clear adhesive layer distal to the flexible substrate, a second optical clear adhesive layer on a side of the first colorless polyimide layer distal to the flexible substrate, and a second colorless polyimide layer on a side of the second optical clear adhesive layer distal to the flexible substrate. The reinforcement layer further includes a hard coating layer on a side of the second colorless polyimide layer distal to the flexible substrate.

In one embodiment, the reinforcement layer comprises a first optical clear adhesive layer, a colorless polyimide layer on a side of the first optical clear adhesive layer distal to the flexible substrate, a second optical clear adhesive layer on a side of the colorless polyimide layer distal to the flexible substrate, and an ultra-thin glass layer on a side of the second optical clear adhesive layer distal to the flexible substrate.

In one embodiment, the reinforcement layer comprises a first optical clear adhesive layer, an ultra-thin glass layer on a side of the first optical clear adhesive layer distal to the flexible substrate, a second optical clear adhesive layer on a side of the ultra-thin glass layer distal to the flexible substrate, and a colorless polyimide layer on a side of the second optical clear adhesive layer distal to the flexible substrate.

In one embodiment, as shown in FIG. 5B, the flexible display device further includes a bottom film layer 1700 on a side of the display layer proximal to the substrate and including an optical clear adhesive layer on a side of the bottom film layer proximal to the substrate.

In one embodiment, as shown in FIG. 5C, the bottom film layer comprises a pressure sensitive adhesive layer 1701 on a side of the display layer proximal to the substrate and a polyimide layer 1702 on a side of the pressure sensitive adhesive layer proximal to the substrate.

The elastic modulus of the first colorless polyimide layer ranges from 3 Gpa to 10 Gpa. The elastic modulus of the second colorless polyimide layer ranges from 3 Gpa to 10 Gpa. The thickness of the first colorless polyimide layer is ranges from 35 μm to 100 μm. In an exemplary embodiment, the thickness of the first colorless polyimide layer is 80 μm. The thickness of the second colorless polyimide layer ranges from 35 μm to 100 μm. In an exemplary embodiment, the thickness of the second colorless polyimide layer is 80 μm. The ultra thin glass layer includes the glass whose elastic modulus ranges from 60 Gpa to 100 Gpa. The thickness of the ultra thin glass layer ranges from 50 to 100 μm.

The reinforcement layer is a multi-layer laminate structure including at least one colorless polyimide layer. The reinforcement layer is adjacent to the touch layer 600. Such a structure can reduce the stress imposed on the display layer 200 and the touch layer 600 when they are bent, which helps to prevent the display layer 200 and the touch layer 600 from being damaged during the bending. So that the reinforcement layer can enhance the reliability testing of the flexible display device.

It will be apparent to those skilled in the art that various changes and modifications can be made in the present disclosure without departing from the spirit and scope of the present disclosure. In this manner, it is intended that the present disclosure is also accompanied by such variations and modifications if the variations and modifications of the present disclosure are within the scope of the appended claims and the equivalents thereof.

What is claimed is:

1. A flexible display panel, comprising:
a flexible substrate;
a display layer on the flexible substrate;
a reinforcement layer on a side of the display layer distal to the flexible substrate; and
a protective layer on a side of the reinforcement layer distal to the flexible substrate;
wherein the reinforcement layer is a multi-layer laminate structure comprising at least one colorless polyimide layer and the reinforcement layer is configured to enhance the reliability testing of the flexible display panel, and
the reinforcement layer comprises a first optical clear adhesive layer, a first colorless polyimide layer on a side of the first optical clear adhesive layer distal to the flexible substrate, a second optical clear adhesive layer on a side of the first colorless polyimide layer distal to the flexible substrate, and a second colorless polyimide layer on a side of the second optical clear adhesive layer distal to the flexible substrate.

2. The flexible display panel according to claim 1, wherein the reinforcement layer further comprises a hard coating layer on a side of the second colorless polyimide layer distal to the flexible substrate.

3. The flexible display module according to claim 1, wherein modulus of the first colorless polyimide layer ranges from 3 Gpa to 10 Gpa.

4. The flexible display panel according to claim 1, wherein a thickness of the first colorless polyimide layer ranges from 35 µm to 100 µm.

5. A flexible display panel, comprising:
a flexible substrate;
a display layer on the flexible substrate;
a reinforcement layer on a side of the display layer distal to the flexible substrate; and
a protective layer on a side of the reinforcement layer distal to the flexible substrate;
wherein the reinforcement layer is a multi-layer laminate structure comprising at least one colorless polyimide layer and the reinforcement layer is configured to enhance the reliability testing of the flexible display panel, and,
wherein the reinforcement layer comprises a first optical clear adhesive layer, a colorless polyimide layer on a side of the first optical clear adhesive layer distal to the flexible substrate, a second optical clear adhesive layer on a side of the colorless polyimide layer distal to the flexible substrate, and an ultra-thin glass layer on a side of the second optical clear adhesive layer distal to the flexible substrate, wherein a thickness of the ultra-thin glass layer ranges from 50 µm to 100 µm.

6. The flexible display module according to claim 5, wherein modulus of the colorless polyimide layer ranges from 3 Gpa to 10 Gpa.

7. The flexible display panel according to claim 5, wherein a thickness of the colorless polyimide layer ranges from 35 µm to 100 µm.

8. A flexible display device, comprising:
a flexible substrate;
a display layer on the flexible substrate;
a touch layer on a side of the display layer distal to the substrate;
a polarizing layer on a side of the touch layer distal to the flexible substrate;
a reinforcement layer on a side of the polarizing layer distal to the flexible substrate; and
a protective layer on a side of the reinforcement layer distal to the flexible substrate;
wherein the reinforcement layer is a multi-layer laminate structure comprising at least one colorless polyimide layer and the reinforcement layer is configured to enhance the reliability testing of the flexible display device.

9. The flexible display device according to claim 8, wherein the reinforcement layer comprises a first optical clear adhesive layer, a first colorless polyimide layer on a side of the first optical clear adhesive layer distal to the flexible substrate, a second optical clear adhesive layer on a side of the first colorless polyimide layer distal to the flexible substrate, and a second colorless polyimide layer on a side of the second optical clear adhesive layer distal to the flexible substrate.

10. The flexible display device according to claim 9, wherein the reinforcement layer further comprises a hard coating layer on a side of the second colorless polyimide layer distal to the flexible substrate.

11. The flexible display device according to claim 8, wherein the reinforcement layer comprises a first optical clear adhesive layer, a colorless polyimide layer on a side of the first optical clear adhesive layer distal to the flexible substrate, a second optical clear adhesive layer on a side of the colorless polyimide layer distal to the flexible substrate, and an ultra-thin glass layer on a side of the second optical clear adhesive layer distal to the flexible substrate.

12. The flexible display device according to claim 8, wherein the reinforcement layer comprises a first optical clear adhesive layer, an ultra-thin glass layer on a side of the first optical clear adhesive layer distal to the flexible substrate, a second optical clear adhesive layer on a side of the ultra-thin glass layer distal to the flexible substrate, and a colorless polyimide layer on a side of the second optical clear adhesive layer distal to the flexible substrate.

13. The flexible display device according to claim 8, further comprising a bottom film layer on a side of the display layer proximal to the substrate.

14. The flexible display device according to claim 13, wherein the bottom film layer comprises a pressure sensitive adhesive layer on a side of the display layer proximal to the substrate and a polyimide layer on a side of the pressure sensitive adhesive layer proximal to the substrate.

15. The flexible display device according to claim 13, further comprising an optical clear adhesive layer on a side of the bottom film layer proximal to the substrate.

* * * * *